(12) United States Patent
Miyazawa

(10) Patent No.: US 7,714,328 B2
(45) Date of Patent: *May 11, 2010

(54) APPARATUS AND METHOD FOR MANUFACTURING ELECTRO-OPTICAL DEVICES

(75) Inventor: Takashi Miyazawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 110 days.

This patent is subject to a terminal disclaimer.

(21) Appl. No.: 11/727,853

(22) Filed: Mar. 28, 2007

(65) Prior Publication Data
US 2007/0170429 A1 Jul. 26, 2007

Related U.S. Application Data

(62) Division of application No. 10/329,948, filed on Dec. 27, 2002, now Pat. No. 7,211,838.

(30) Foreign Application Priority Data
Dec. 27, 2001 (JP) .............................. 2001-398522

(51) Int. Cl.
*H01L 29/04* (2006.01)
(52) U.S. Cl. ............................ 257/59; 257/649; 257/72; 257/E39.007; 257/E51.001; 257/E51.052; 257/E27.117; 257/E27.119; 257/187; 257/98
(58) Field of Classification Search ............... 257/287, 257/98, 59, 649, E39.007, E51.001, E27.117, 257/E27.119, 187
See application file for complete search history.

(56) References Cited

U.S. PATENT DOCUMENTS

| | | | |
|---|---|---|---|
| 4,402,927 | A | 9/1983 | Von Dardel et al. |
| 5,198,267 | A | 3/1993 | Aharoni et al. |
| 5,891,554 | A | 4/1999 | Hosokawa et al. |

(Continued)

FOREIGN PATENT DOCUMENTS
CN 1296295 11/1999

(Continued)

OTHER PUBLICATIONS

Tessler, N. et al., "Optoelectronic Devices Based on Hybrid Organic-Inorganic Structures", Optical Materials, Elsevier Science Publishers B.V., Amsterdam, NL, vol. 17, No. 1-2, Jun. 2001.

(Continued)

*Primary Examiner*—Wael Fahmy
*Assistant Examiner*—Marc Armand
(74) *Attorney, Agent, or Firm*—Oliff & Berridge, PLC

(57) ABSTRACT

The present invention provides an electro-optical device capable of achieving an increased light emission efficiency and an enhanced visibility. An organic electroluminescents (EL) display device has a plurality of material layers including a luminescent layer. In a plurality of material layers layered in the direction of light emission from the luminescent layer, first and second insulating interlayers are disposed between a substrate, which is positioned at the outermost surface, and the luminescent layer. The first and second insulating interlayers have a refractive index lower than that of the substrate. Accordingly, by forming predetermined materials having a low refractive index, the resulting low refractive index layers have a low dielectric constant, and consequently, the capacity between wires can be reduced.

10 Claims, 4 Drawing Sheets

U.S. PATENT DOCUMENTS

| | | | |
|---|---|---|---|
| 6,002,139 A * | 12/1999 | Katagiri | 250/556 |
| 6,124,024 A | 9/2000 | Hosokawa et al. | |
| 6,147,737 A | 11/2000 | Yachi | |
| 6,210,858 B1 | 4/2001 | Yasuda et al. | |
| 6,359,606 B1 | 3/2002 | Yudasaka | |
| 6,383,559 B1 | 5/2002 | Nakamura et al. | |
| 6,399,222 B2 | 6/2002 | Arai et al. | |
| 6,492,778 B1 | 12/2002 | Segawa | |
| 6,495,203 B2 * | 12/2002 | Anderson et al. | 427/166 |
| 6,674,106 B2 | 1/2004 | Tanaka et al. | |
| 6,740,416 B1 | 5/2004 | Yokogawa et al. | |
| 6,768,257 B1 | 7/2004 | Yamada et al. | |
| 6,991,506 B2 | 1/2006 | Yamada et al. | |
| 2002/0139980 A1 * | 10/2002 | Yamazaki | 257/72 |

FOREIGN PATENT DOCUMENTS

| | | |
|---|---|---|
| EP | 0 989 443 A2 | 3/2000 |
| EP | 1 093 322 A1 | 4/2001 |
| EP | 1 100 129 A2 | 5/2001 |
| EP | 1 146 093 A1 | 10/2001 |
| JP | 53-112732 | 10/1978 |
| JP | A 57-9051 | 1/1982 |
| JP | A 57-51781 | 3/1982 |
| JP | A 59-194393 | 11/1984 |
| JP | A 63-70257 | 3/1988 |
| JP | A 63-175860 | 7/1988 |
| JP | A 2-135359 | 5/1990 |
| JP | A 2-135361 | 5/1990 |
| JP | A 2-209988 | 8/1990 |
| JP | A 3-37992 | 2/1991 |
| JP | A 3-152184 | 6/1991 |
| JP | A 03-222287 | 10/1991 |
| JP | 07-325202 * | 12/1995 |
| JP | 07325203 * | 12/1995 |
| JP | A-09-288201 | 11/1997 |
| JP | A-11-074073 | 3/1999 |
| JP | A 11-195487 | 7/1999 |
| JP | A 2000-260571 | 9/2000 |
| JP | A 2000-323273 | 11/2000 |
| JP | A-2000-356963 | 12/2000 |
| JP | A 2001-72408 | 3/2001 |
| JP | A 2001-176653 | 6/2001 |
| JP | A-2001-195008 | 7/2001 |
| JP | A 2001-202827 | 7/2001 |
| JP | A-2001-242803 | 9/2001 |
| JP | A-2001-249627 | 9/2001 |
| KR | 2001-0060297 | 7/2001 |
| TW | 438993 | 6/2001 |
| WO | WO 00/04593 | 1/2000 |
| WO | WO 01/34382 A1 | 5/2001 |

OTHER PUBLICATIONS

Homma, T., "Low Dielectric Constant Materials and Methods for Interlayer Dielectric Films in Ultralarge-Scale Integrated Circuit Multilevel Interconnections", Materials Science and Engineering R., Reports, Elsevier Sequoia S.A., Lausanne, CH, vol. 23, No. 6, Sep. 15, 1998.

Tessler et al.: "Optoelectronic devices based on hybrid organic-inorganic structures," Optical Materials, vol. 17, No. 1-2, Jun. 1, 2001, pp. 155-160, XP004254812 ISSN: 0925-3467.

Tsutsui et al.: "Doubling Coupling-Out Efficiency in Organic Light-Emitting Devices Using a Thin Silica Aerogel Layer," Advanced Materials, vol. 13, No. 15, Aug. 3, 2001, pp. 1149-1152, XP001129642 ISSN: 0935-9648.

* cited by examiner

LIGHT

APPARATUS AND METHOD FOR MANUFACTURING ELECTRO-OPTICAL DEVICES

This is a Divisional of application Ser. No. 10/329,948 filed Dec. 27, 2002. The entire disclosure of the prior application is hereby incorporated by reference herein in its entirety.

BACKGROUND OF THE INVENTION

1. Field of the Invention

The present invention relates to an electro-optical device capable of efficiently transmitting light emitted or modulated by an electro-optical element and to a method for manufacturing the electro-optical device. The present invention also relates to electronic apparatuses and a circuit board, including the electro-optical device, and to a method for manufacturing the circuit board.

2. Description of Related Art

Currently, some related art electro-optical devices, such as liquid crystal devices and organic EL (electroluminescence) devices, have a plurality of circuit elements, electrodes, and liquid crystal or EL elements layered on a substrate. For example, an organic EL device has luminescent elements, each including electrode layers serving as an anode and a cathode and a luminescent layer containing a luminescent material disposed between the electrode layers. The organic EL device uses a phenomenon in which holes injected from the anode side and electrons injected from the cathode side are recombined in the luminescent layer capable of emitting light and the luminescent layer emits light when an excited state is deactivated.

SUMMARY OF THE INVENTION

Since the electro-optical devices generally include a plurality of material layers including an electro-optical layer, light emitted or modulated in the electro-optical devices decays while traveling to the outside through the material layers. Consequently, these devices cannot efficiently emit the light.

Accordingly, an object of the present invention is to provide an electro-optical device having an increased efficiency of light emission to the outside and a high visibility, and to provide a method for manufacturing the electro-optical device, a circuit board, and a method for manufacturing the circuit board.

To this end, the present invention is directed to an electro-optical device having a plurality of material layers including an electro-optical element layer having electro-optical elements. The electro-optical device includes a plurality of material layers layered in the direction of light emission from the electro-optical elements. The material layers include a surface material layer disposed at the outermost surface thereof and a low-refractive-index layer disposed between the surface material layer and the electro-optical element layer. The low-refractive-index layer has a refractive index lower than that of the surface material layer.

The light emission from the electro-optical elements here can refer to not only light emitted by the electro-optical elements, but also transmitted or reflected light modulated by the electro-optical elements. The surface material layer disposed at the outermost surface thereof can refer to a material layer in contact with the outside.

According to the present invention, light emitted from electro-optical elements passes through the low-refractive-index material layer having a refractive index lower than that of the surface material layer and enters the surface material layer. Light entering the low-refractive-index layer at an angle more than or equal to the critical angle is refracted in a direction forming an angle less than or equal to the critical angle at the interface with the surface material layer. Thus, the light is deviated from total reflection conditions to be emitted to the outside and light emission efficiency can be increased to achieve an enhanced visibility. Also, there is a strong correlation between the refractive index and the dielectric constant. By setting the refractive index of some material layers to be low, low-dielectric-constant layers can be provided.

The electro-optical elements may be liquid crystal elements, electrophoretic elements, or electron-emissive elements. In the structure of the electro-optical device described above, however, it is particularly preferable that the electro-optical elements be luminescent elements. The luminescent elements may be LED (light-emitting diode) elements, LD (laser diode) elements, EL (electroluminescent) elements, or luminescent elements including electron-emissive elements.

In the electro-optical device, by allowing the low refractive later to serve as an insulating interlayer, the emission efficiency of light passing through the insulating interlayer can be increased.

Since there is a strong correlation between the refractive index and the dielectric constant, capacitance generated between the wires can be advantageously reduced when conductive members, such as the wires and electrodes, are insulated with the insulating interlayer. Thus, an electro-optical device having a high light emission efficiency and capable of high-speed operation can be achieved.

Preferably, the refractive index of the low-refractive-index layer is 1.5 or less, and more preferably 1.2 or less.

The low-refractive-index material may be aerogel, porous silica, magnesium fluoride or a material containing magnesium fluoride, a gel in which magnesium fluoride particles are dispersed, a fluoropolymer or a material containing the fluoropolymer, or a porous polymer having a side chain structure. Also, the low-refractive-index material may include a predetermined material containing at least either inorganic particles or organic particles.

The electro-optical elements may be organic electroluminescent elements. The organic electroluminescent elements have various advantages in that, for example, they can be operated at low voltage and have an angle-dependent visibility lower than that of liquid crystal elements.

The electro-optical device may include active elements. Thus, active driving can be achieved. The active elements may be, for example, transistors, such as thin-film transistors, or thin-film diodes.

The present invention also directed to a method for manufacturing an electro-optical device. The method can include the steps of disposing thin-film transistors on a first base material, and forming a low-refractive-index layer on a second base material including the thin-film transistors and the first base material.

The present invention is also directed to a circuit board having a substrate and a plurality of material layers on the substrate. The plurality of material layers can include at least one low-refractive-index layer formed of a low-refractive-index material having a refractive index lower than that of the substrate.

In the circuit board, the plurality of material layers can include at least one insulating interlayer formed of the low-refractive-index material. Preferably, the refractive index of the low-refractive-index layer is 1.5 or less, and more preferably 1.2 or less.

The low-refractive-index material may be light-transmissive porous material, aerogel, porous silica, magnesium fluoride, a fluoropolymer, or a porous polymer. Alternatively, the low-refractive-index material may comprise a predetermined material containing at least either inorganic particles or organic particles, or a gel in which magnesium fluoride particles are dispersed.

In this instance, the circuit board may include active elements. The active elements may be transistors.

The present invention is also directed to a method for manufacturing a circuit board. The method can include the steps of disposing transistors on a first base material, and forming a low-refractive-index layer on a second base material including the transistors and the first base material.

The present invention also directed to an electronic apparatus including the electro-optical device or the circuit board described above.

According to the present invention, an electronic apparatus having a display capable displaying high-quality, bright images can be achieved.

BRIEF DESCRIPTION OF THE DRAWINGS

The invention will be described with reference to the accompanying drawings, wherein like numbers reference like elements, and wherein.

DETAILED DESCRIPTION OF PREFERRED EMBODIMENTS

Figure 1:
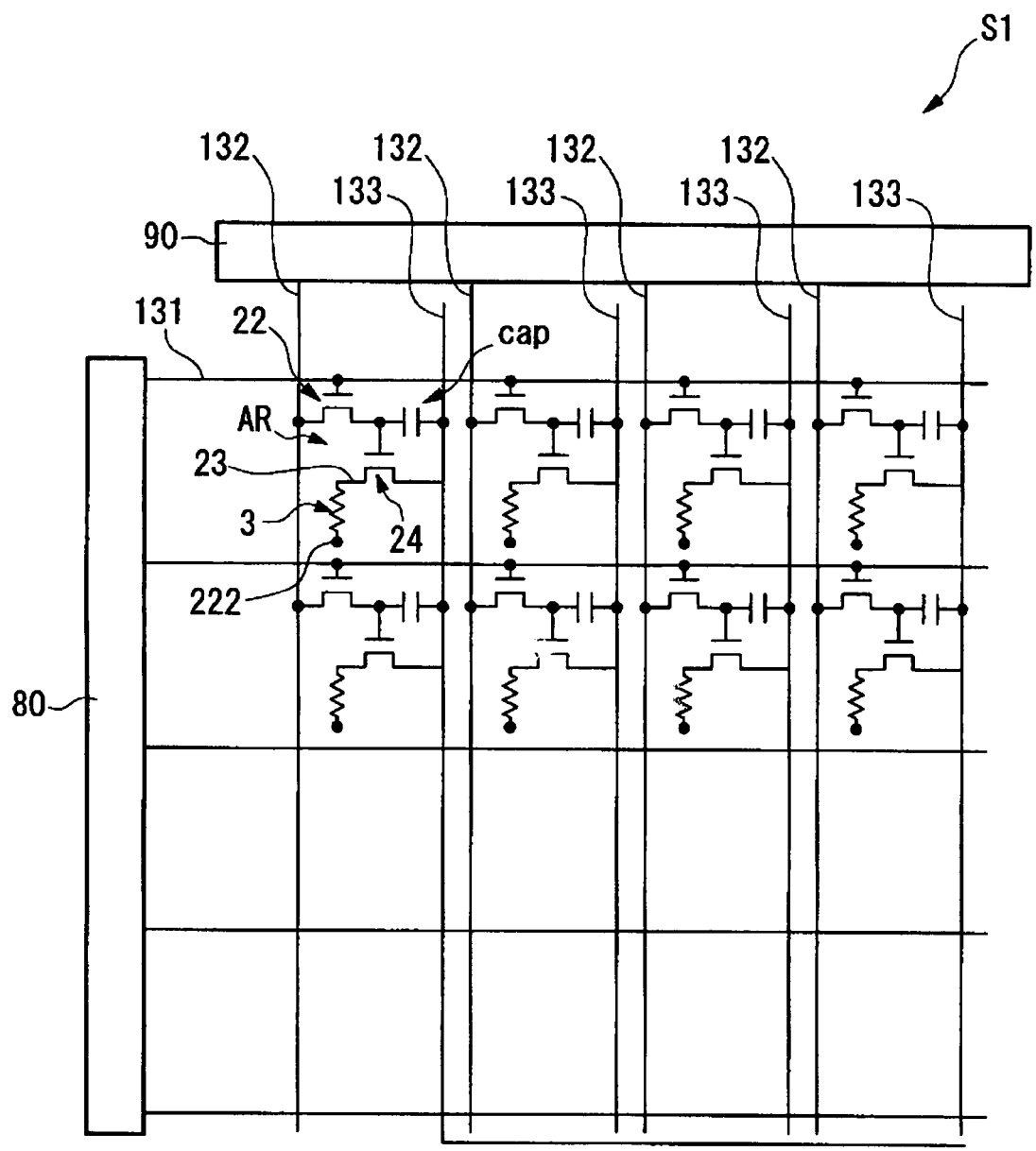
FIG. 1 is a schematic illustration of an electroluminescent display device, acting as an electro-optical device, according to an embodiment of the present invention.
Figure 2:
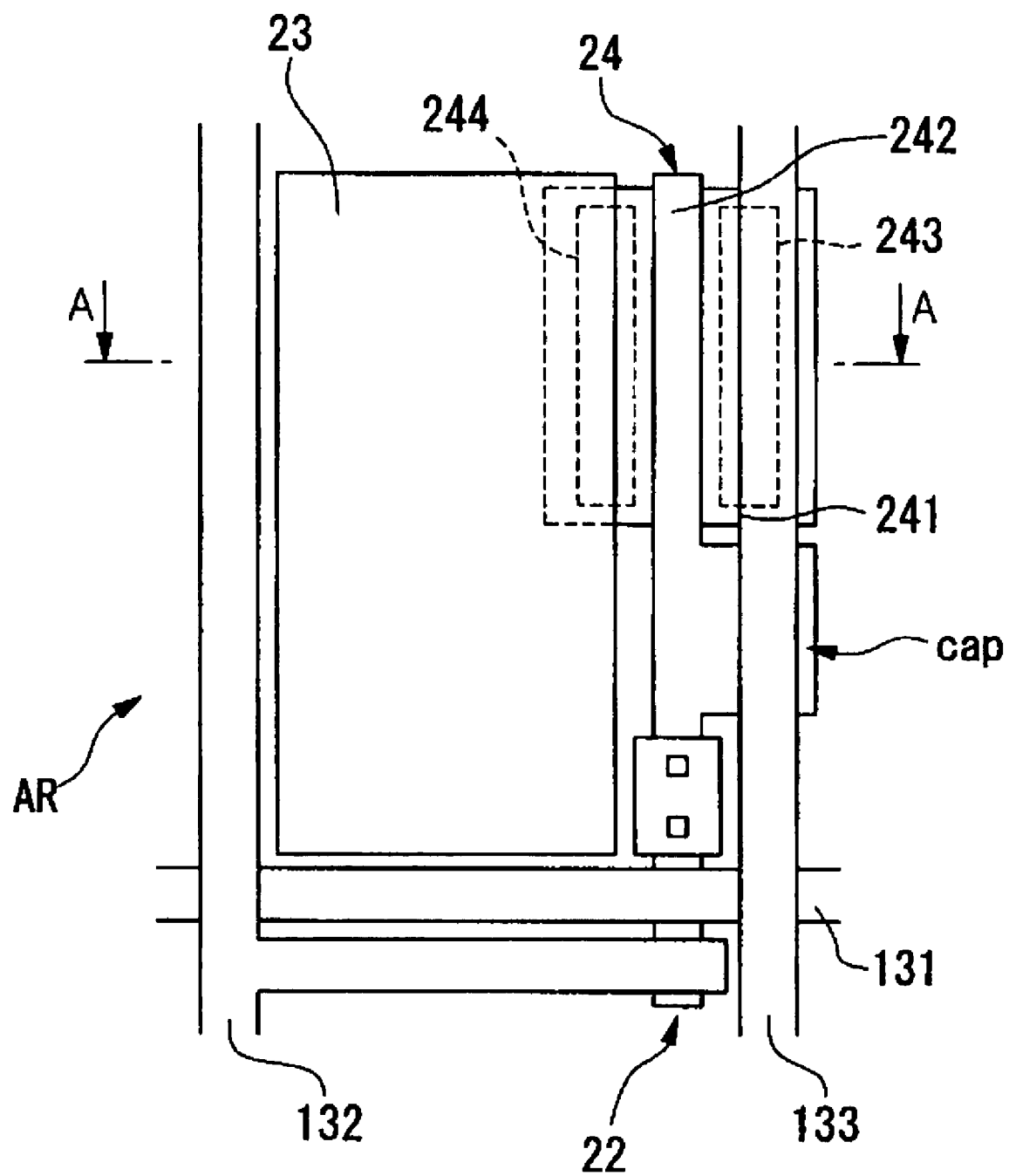
FIG. 2 is an enlarged plan view of a pixel region of the display device shown in FIG. 1.

An electro-optical device of the present invention will now be illustrated with reference to FIGS. 1, 2, and 3. FIGS. 1 and 2 show an exemplary electro-optical device of the present invention, using an active matrix display device including organic EL elements. FIG. 1 is a circuit diagram of an entire circuit board and FIG. 2 is an enlarged plan view of a pixel in which an opposing electrode and an organic electroluminescent element, acting as a luminescent element shown in FIG. 1, are omitted.

In the embodiment, a display device including organic electroluminescent elements (hereinafter referred to as "EL element", if necessary) will be illustrated. However, it should be understood that the present invention may be applied to other types of display devices including liquid crystal elements, electrophoretic elements, or electron-emissive elements, or including other types of luminescent elements, such as LEDs (light emitting diodes) elements and LDs (laser diodes).

As shown in FIG. 1, the organic electroluminescent display device S1 (hereinafter referred to as an "organic EL display device", if necessary) includes a substrate, a plurality of scanning lines 131 disposed on the substrate, a plurality of data lines 132 extending so as to intersect the scanning lines 131, and a plurality of common power-supply lines 133 extending alongside the data lines 132. Pixels (pixel area elements) AR are arranged corresponding to the intersections of the scanning lines 131 and the data lines 132.

The data lines 132 are electrically connected to a data line driving circuit 90 including at least one selected from the group of a shift register, a level shifter, a video line, a D/A converter, a decoder, a latch circuit, and an analog switch.

On the other hand, the scanning lines 131 are electrically connected to a scanning line driving circuit 80 including at least one selected from the group consisting of a shift register, a level shifter, and a decoder.

In this embodiment, both the data line driving circuit 90 and the scanning line driving circuit 80 are disposed on the substrate. However, whether the data line driving circuit 90 and the scanning line driving circuit 80 are disposed on the substrate or outside the substrate can be determined as required.

As shown in FIG. 1, each pixel area AR can include a first thin-film transistor 22 having a gate electrode to which scanning signals are transmitted through the corresponding scanning line 131, and a hold capacitor cap for holding an image signal supplied from the corresponding data line 132 through the first thin-film transistor 22. The pixel area AR can also include a second thin-film transistor 24 having a gate electrode to which the image signals held in the hold capacitor cap is transmitted, and a pixel electrode 23 to which driving current is transmitted from the corresponding common power supply line 133 when the pixel electrode 23 is electrically connected to the common power supply line 133 with the second thin-film transistor 24. A luminescent element 3 is also disposed between the pixel electrode (anode) 23 and an opposing electrode (cathode) 222. Instead of EL (electroluminescent) elements, LEDs (light-emitting diodes) or LDs (laser diodes) may be used as the luminescent element 3.

When the first thin-film transistor 22 is activated according to a scanning signal supplied through the scanning line 131, electric charge corresponding to a data signal supplied through the data line 132 is held in the hold capacitor acp, and thus the conduction state of the second thin-film transistor 24 is determined depending on the state of the hold capacitor cap. A current flows from the common power supply line 133 to the pixel electrode 23 through the second thin-film transistor 24 and to the opposing electrode 222 through a luminescent layer 60. Thus, the luminescent layer 60 emits light depending on the amount of the current.

The plan structure of the pixel AR will now be described with reference to FIG. 2. FIG. 2 is an enlarged plan view of one of the pixels shown in FIG. 1 in which the opposing electrode and the organic electroluminescent element are omitted. As shown in FIG. 2, the pixel electrode 23 is disposed in rectangular shape when viewed from above, and all sides of the pixel electrode 23 are surrounded by the corresponding data line 132, common power supply line 133, and scanning line 131 and a scanning line for another pixel electrode not shown in the drawing. It should be understood that the shape of the pixel electrode is not limited to being rectangular, but may be circular or oval. If the material layers defining the EL element including the luminescent layer are formed of liquid materials by, for example, an ink jet technique, a circular or oval pixel electrode not having corners helps form uniform material layers.

The sectional structure of the organic EL display device will now be described with reference to FIG. 3. FIG. 3 is a sectional view taken along line A-A in FIG. 2.

Figure 3:
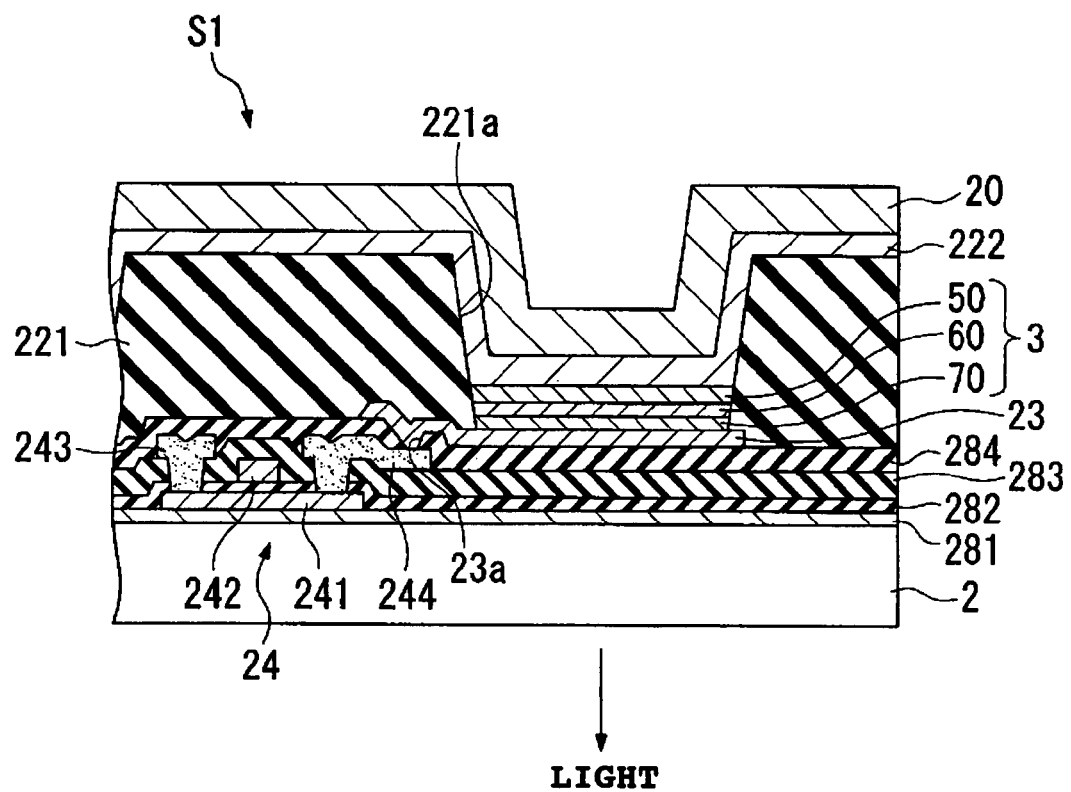
FIG. 3 is a sectional view of the electro-optical device according to the embodiment, taken along line A-A in FIG. 2.

The organic EL display device shown in FIG. 3 is a so-called back emission type in which light is emitted from the substrate 2 side having the thin-film transistors (TFTs).

Accordingly, in this embodiment, the substrate 2 serves as the outermost material layer through which light from the luminescent elements 3 passes to the outside. If another material layer is layered on the surface of the substrate 2, that layer serves as the outermost material layer.

As shown in FIG. 3, the back emission organic type organic EL display device S1 can include the substrate 2, a transparent anode (pixel electrode) 23 formed of indium tin oxide (ITO) or the like, a luminescent element 3 disposed on the anode 23, a cathode (opposing electrode) 222 overlying the anode 23 with the luminescent element 3 therebetween, and a thin-film transistor (hereinafter referred to as a TFT) 24 serving as an energization controller for controlling energization of the pixel electrode 23. In addition, a sealing layer 20 is disposed on the cathode 222. The cathode 222 is formed of at least one metal selected from the group of aluminium (Al), magnesium (Mg), gold (Au), silver (Ag), and calcium (Ca). The cathode 222 may be an alloy film or a laminate formed of those metals. The TFT 24 operates according to operation instructing signals from the scanning line driving circuit 80 and the data line driving circuit 90 to control the energization of the pixel electrode 23.

The luminescent element 3 is substantially composed of a hole transport layer 70 capable of transporting holes from the anode 23, a luminescent layer 60 containing an organic EL material which is one of electro-optical materials, and an electron transport layer 50 disposed on the upper surface of the luminescent layer 60. The cathode (opposing electrode) 222 is disposed on the upper surface of electron transport layer 50.

The TFT 24 is disposed above the surface of the substrate 2 with a protective underlayer 281 mainly containing $SiO_2$ therebetween. The TFT 24 includes a silicon layer 241 disposed on the protective underlayer 281, a gate insulating layer 282 disposed on the protective underlayer 281 so as to cover the silicon layer 241, a gate electrode 242 on the upper surface of the gate insulating layer 282, opposing the silicon layer 241, a first insulating interlayer 283 disposed on the gate insulating layer 282 so as to cover the gate electrode 242, a source electrode 243 connected to the silicon layer 241 through a contact hole formed in the gate insulating layer 282 and the first insulating inter layer 283, a drain electrode 244 opposing the source electrode 243 with the gate electrode 242 therebetween and connected to the silicon layer 241 through a contact hole formed in the gate insulating layer 282 and the first insulating interlayer 283, and a second insulating interlayer 284 disposed on the first insulating interlayer 283, so as to cover the source electrode 243 and the drain electrode 244.

The pixel electrode 23 is disposed on the upper surface of the second insulating interlayer 284, and is connected to the drain electrode 244 through a contact hole 23a formed in the second insulating interlayer 284. Also, a third insulating layer (bank layer) 221 formed of a synthetic resin or the like is disposed between the cathode 222 and the region of the second insulating interlayer 284 in which the luminescent element (EL element) 3 are not formed.

The drain electrode 244 may be provided with a TFT protection layer on the surface thereof. The material of the protection layer may be an insulating film containing silicon (preferably a silicon nitride oxide film or a silicon nitride film). This protection layer serves to protect the TFT 24 from metal ions and water. Specifically, the protection layer prevents movable ions such as metal ions from entering the TFT 24.

If the protection layer has the effect of dissipating heat, it can advantageously prevent thermal degradation of the luminescent element. If the luminescent element is formed of an organic material, however, the luminescent element is degraded by oxygen. Therefore, it is preferable that the protection layer be not formed of an insulating film easily releasing oxygen.

Such a light-transmissive insulating film capable of preventing transmission of movable ions and having the effect of releasing heat may contain at least one element selected from the group consisting of B (boron), C (carbon), and N (nitrogen) and at least one element selected from the group of Al (aluminium), Si (silicon), and P(phosphorus). For example, nitrides containing aluminium such as aluminium nitride ($Al_xN_y$), carbide containing silicon such as silicon carbide ($Si_xC_y$), nitrides containing silicon such as silicon nitride ($Si_xN_y$), nitrides containing boron such as boron nitride ($B_xN_y$), and phosphides containing boron such as boron phosphide ($B_xP_y$) may be used. Oxides containing aluminium such as aluminium oxide ($Al_xO_y$) are also preferable because it is light-transmissive and has a thermal conductivity of 20 $Wm^{-1}K^{-1}$. These materials can prevent the entry of water as well as having the above-described effects.

Those compounds may be combined with other elements. For example, aluminium nitride oxide expressed by $AlN_xO_y$, formed by adding nitrogen to aluminium oxide may be used. This material also has the effects of releasing heat and of preventing the entry of water and movable ions.

Other insulating films containing Si, Al, N, O, and M may be used, wherein M represents at least one of rare earth elements, and preferably at least one element selected from the group consisting of Ce (cesium), Yb (ytterbium), Sm (samarium), Er (erbium), Y (yttrium), La (lanthanum), Gd (gadolinium), Dy (dysprosium), and Nd (neodymium). These materials also have the effects of releasing heat and of preventing the entry of water and movable ions.

Alternatively, carbon films containing at least a diamond thin film or an amorphous carbon film (particularly having characteristics similar to diamond, referred to as diamond-like carbon or the like) may be used. These films have extremely high thermal conductivity and are, therefore, useful for a cooling layer. However, a film having a large thickness has a brown tinge and reduces the transmittance thereof. It is desired that the film have a thickness as small as possible (preferably in the range of 5 to 100 nm).

Since the protection layer is intended to protect the TFT from movable ions and water, it is preferable that the material of the protection layer does not degrade this effect. Although a thin film containing the above-described material having the effect of dissipating heat may be used singly as the protection layer, it is advantageous to layer the thin film and an insulating film capable of preventing the transmission of movable ions and water (typically a silicon nitride ($Si_xN_y$) film or silicon nitride oxide ($SiO_xN_y$) film).

The region of the silicon layer 241 opposing the gate electrode 242 with the gate insulating layer 282 therebetween is a channel region. The source side of the channel region in the silicon layer 241 is a source region. On the other hand, the drain side of the channel region is a drain region. The source region is connected to the source electrode 243 through a contact hole formed in the gate insulating layer 282 and the first insulating interlayer 283. The drain region is connected to the drain electrode 244 formed in the same layer as the source electrode 243 through a contact hole formed in the gate insulating layer 282 and the first insulating interlayer 283. The pixel electrode 23 is connected to the drain region of the silicon layer 241 through the drain electrode 244.

In this embodiment, since light emitted from the luminescent layer 60 passes through the substrate 2 having the TFT 24 to the outside (back emission type), the substrate 2 is formed of a light-transmissive, transparent or translucent material, such as transparent glass, quartz, sapphire, or a transparent synthetic resin, such as polyester, polyacrylate, polycarbonate, or polyether ketone. In particular, soda-lime glass is advantageously used as a constituent of the substrate. In use of soda-lime glass, preferably, the substrate is coated with silica to protect the soda-glass from acids and alkalis and to improve the uniformity of the substrate.

The substrate may be provided with a color filter layer, a color-converting layer containing a luminescent material, or a dielectric substance reflection layer to control the color of luminescence.

If emitted light passes through the side opposite to the substrate 2 having the TFT 24 to the outside (top emission type), the substrate 2 is not necessary to be transparent and may be formed of ceramics, such as alumina, metallic sheets such as stainless steel subjected to surface oxidation or other surface insulation treatments, thermosetting resins, or thermoplastic resins.

When the protective underlayer 281 is formed, the substrate 2 is subjected to plasma CVD using TEOS (tetraethoxysilane) or oxygen gas as a material to deposit a silicon nitride film acting as the protective underlayer 281 at a thickness of about 200 to 500 nm.

When the silicon layer 241 is formed, the substrate 2 is, first, heated to about 350° C. and the protective underlayer 281 is subjected to plasma CVD or ICVD to deposit an amorphous silicon film at a thickness of about 30 to 70 nm. Next, the amorphous silicon film is crystallized by laser annealing, flash heating, or solid phase deposition to form a crystallized polysilicon layer. The laser annealing is performed using a line beam emitted from an excimer laser, having a length of 400 mm and an output intensity of, for example, 200 mJ/cm$^2$. The line beam is scanned such that the area corresponding to 90% of the leaser peak intensity in the width direction of the line beam overlaps targeted regions. Next, the polysilicon layer is subjected to patterning by photolithography to form an island-shaped silicon layer 241.

The silicon layer 241 can include the channel region and the source and drain regions of the second thin-film transistor 24 shown in FIG. 1 and, in a sectional view at a different position, also includes a channel region and source and drain regions of the first thin-film transistor 22. Specifically, these two transistors 22 and 24 are formed at one time through the same procedure. As for the transistors, therefore, only the second thin-film transistor 24 will be described and the description of the first thin-film transistor 22 is omitted.

When the gate insulating layer 282 is formed, the surface of the silicon layer 241 is subjected to plasma CVD using TEOS or oxygen gas as a material to deposit a silicon oxide or silicon nitride film at a thickness of about 60 to 150 nm.

In order to form the gate electrode 242, a conductive film containing a metal, such as aluminium, tantalum, molybdenum, titanium, or tungsten, is deposited on the gate insulating layer 282 by sputtering and is subsequently subjected to patterning.

In order to form the source region and the drain region in the silicon layer 241, after forming the gate electrode 242, phosphorus ions are implanted using the gate electrode 242 as a patterning mask. As a result, a high concentration dopant is introduced into the gate electrode 242 in a self-alignment manner and, thus, the source region and the drain region are formed in the silicon layer 241. The region where the dopant is not introduced is the channel region.

The first insulating interlayer 283 is formed of a material having a refractive index lower than that of the substrate 2, on the upper surface of the gate insulating layer 282.

The first insulating interlayer 283 may be a silicon oxide film, a nitride film, a porous silicon oxide ($SiO_2$) film, or the like. The first insulating interlayer 283 formed of a porous $SiO_2$ film is deposited by CVD (chemical vapor deposition) using $Si_2H_6$ and $O_3$ as a reaction gas. These gases help form large $SiO_2$ particles in a gas phase, and these large particles are deposited on the gate insulating layer 282. As a result, the first insulating interlayer 283 has many pores therein and becomes a porous film. The resulting porous first insulating interlayer 283 has a low refractive index, consequently increasing the efficiency of light emission to the outside.

Preferably, the density of the porous layer having a low refractive index is 0.4 g/cm$^3$ or less.

The refractive index of the first insulating interlayer 283 acting as a low-refractive-index layer is 1.5 or less, and preferably 1.2 or less.

The surface of the first insulating interlayer 283 may be subjected to H (hydrogen) plasma treatment. As a result, dangling bonds of Si—O bonds on the surfaces defining the pores are replaced with Si—H bonds and, thus, the non-hygroscopicity of the film is improved. The first insulating interlayer 283 subjected to the plasma treatment may be provided with another $SiO_2$ layer on the surface thereof.

When the first insulating interlayer 283 is deposited by CVD, $Si_2H_6+O_2$, $Si_3H_8+O_3$, or $Si_3H_8+O_2$ may be used as the reaction gas, instead of $Si_2H_6+O_3$. In addition to these gases, a reaction gas containing B (boron) or F (fluorine) may be used.

When the first insulating interlayer 283 is formed of a porous film, by depositing the porous $SiO_2$ film and a normal $SiO_2$ film formed by reduced-pressure chemical vapor deposition, the film characteristics of the resulting porous first insulating interlayer 283 can be stable. In order to deposit these films, a plasma can be generated intermittently or periodically in an atmosphere of $SiH_4$ and $O_2$ gases under a reduced pressure. Specifically, in order to form the fist insulating interlayer 283, the substrate 2 is placed in a predetermined chamber maintained at a temperature of, for example, 400° C., and a RF voltage is applied to the chamber using $SiH_4$ and $O_2$ as the reaction gas. In this process, while the flow rate of $SiH_4$ and $O_2$ gases are constant, the RF voltage is periodically applied to the chamber at intervals of 10 seconds. Accordingly, the plasma is generated and destroyed in a cycle of 10 seconds by using a plasma changing with time, a reduced-pressure CVD process and a plasma CVD process under a reduced pressure can be repeated in one chamber. Also, by repeating the reduced-pressure CVD and the plasma CVD under a reduced pressure, the resulting $SiO_2$ film has many pores therein. Hence, the first insulating interlayer 283 becomes porous.

The first insulating interlayer 283 may be formed of aerogel. Aerogel is a light-transmissive porous material having an ultrastructure, and is prepared by subjecting a metal alkoxide to sol-gel reaction and subsequently by supercritical-drying the resulting wet gel. The types of aerogel include silica aerogel and alumina-based aerogel. Silica aerogel has 90% of pores relative to the volume, and the other part of the volume is constituted of fine $SiO_2$ particles having a size of tens of nanometers aggregated in a dendritic manner. Since the particle size is smaller than wavelengths of light, the silica aerogel is light-transmissive and has a refractive index of 1.2 or less. The refractive index can be controlled by varying the pore ratio. The refractive indexes of glass and quartz, which may be a constituent of the substrate 2, are 1.54 and 1.45, respectively.

The silica aerogel is prepared by a sol-gel technique through a wet gel-preparing step, a wet gel-ageing step, and a supercritical drying step of drying the wet gel to obtain aerogel. In supercritical drying, liquid in a jelly-like gel composed of a solid phase and a liquid phase is replaced with a supercritical fluid and is thus removed. The supercritical drying is suitable for drying gel without shrinkage, and results in an aerogel having a high pore ratio.

For example, when the first insulating interlayer 283 is formed of silica aerogel, the gate insulating layer 282 is coated with a wet gel, which is an aerogel material, by spin coating or the like and supercritical drying. By performing the supercritical drying, the solvent in the wet gel is replaced with a supercritical fluid and removed. Exemplary supercritical fluids include carbon dioxide ($CO_2$), alcohols such as methanol and ethanol, $NH_3$, $H_2O$, $N_2O$, methane, ethane, ethylene, propane, pentane, isopropyl alcohol, isobutyl alcohol, cyclotrifluoromethane, monofluoromethane, and cyclohexanol.

When each low-refractive-index layer (each insulating layer) is formed of silica aerogel, a wet gel is applied onto a base material by spin coating, followed by supercritical drying. In this instance, the wet gel may contain a synthetic resin (organic substance). The synthetic resin is light-transmissive and has a thermal degeneration point higher than the critical temperature of the supercritical fluid. For example, when an alcohol is used as the supercritical fluid, the synthetic resin must be light-transmissive and have a thermal degeneration point higher than the critical temperature of the alcohol. Such resins include hydroxylpropyl cellulose (HPC), polyvinyl butyral (PVB), and ethyl cellulose (EC) (PVB and EC are soluble in alcohol, but insoluble in water). If ether is used as the solvent, preferably, polyethylene chloride or the like is used as the resin. If $CO_2$ is used as the solvent, preferably, HPC or the like is used as the resin.

Instead of silica aerogel, low-refractive-index layers may be formed of an alumina-based aerogel or other light-transmissive, porous materials having a refractive index lower than that of the substrate 2. Preferably, the density of the porous material (aerogel) is 0.4 g/cm$^3$ or less.

The low-refractive-index layers are not needed to be porous, and may be formed of a light-transmissive polymeric adhesive having a refractive index lower than that of the substrate 2, such as an epoxy adhesive (refractive index: 1.42) or an acrylic resin (refractive index: 1.43). Since the resulting layer has a refractive index lower than that of the substrate 2 even if these adhesives are used singly, the efficiency of light emission to the outside can be increased.

Also, the low-refractive-index layers may be formed of porous silica, magnesium fluoride (refractive index: 1.38), or a material containing magnesium fluoride. A low-refractive-index layer of magnesium fluoride can be formed by sputtering. The low-refractive-index layers may be formed of a gel in which magnesium fluoride particles are dispersed. Also, the low-refractive-index layers may be formed of a fluoropolymer or a material containing a fluoropolymer, such as perfluoroalkyl polyether, perfluoroalkylamine, or a mixture of perfluoroalkyl polyether and perfluoroalkylamine.

In addition, the low-refractive-index layers may be formed of a material containing a predetermined polymer binder and a soluble or dispersive fluorocarbon having a low refractive index.

Exemplary polymer binders can include polyvinyl alcohol, polyacrylic acid, polyvinylpyrrolidone, sodium polyvinylsulfonate, polyvinylmethyl ether, polyethylene glycol, poly(α-(trifluoromethyl)acrylic acid), polyvinyl methyl ether-maleic anhydride copolymer, polyethylene glycol-propylene glycol copolymer, and polymethacrylic acid.

Exemplary fluorocarbons can include ammonium perfluorooctanoate, tetramethylammonium perfluorooctanoate, ammonium perfluoroalkylsulfonates having a carbon number of 7 or 10, tetramethylammonium perfluoroalkylsulfonates having a carbon number of 7 or 10, fluorinated quaternary alkylammonium iodides, and perfluoroadipic acid, and perfluoroadipic acid quaternary ammonium salts.

Since it is advantageous to introduce pores into the low-refractive-index layer, particles may be used, instead of the above-described aerogel, to form pores acting as micro voids among or in the particles. As the particles, inorganic or organic particles may be used for the low-refractive-index layers.

Inorganic particles are, preferably, amorphous. The inorganic particles are constituted of, preferably, a metal oxide, a nitride, a sulfide, or a halide, more preferably a metal oxide or a metal halide, and most preferably a metal oxide or metal fluoride. Preferred metal elements include Na, K, Mg, Ca, Ba, Al, Zn, Fe, Cu, Ti, Sn, In, W, Y, Sb, Mn, Ga, V, Nb, Ta, Ag, Si, B, Bi, Mo, Ce, Cd, Be, Pb, and Ni, and more preferably Mg, ca, B, and Si. An inorganic compound containing two types of metals may be used. Particularly preferred inorganic compound is silicon dioxide, that is, silica.

The micro voids in the inorganic particles are formed by cross-linking silica molecules of the particles. By cross-linking the silica particles, the volume is reduced, and thus the particles become porous. The (porous) inorganic particles having micro voids can be directly prepared as a dispersoid by a sol-gel process (disclosed in Japanese Unexamined Patent Application Publication No. 53-112732 and Japanese Examined Patent Application Publication No. 57-9051) or deposition (disclosed in APPLIED OPTIC, 27, pp 3356(1988)). The dispersoid may be obtained by preparing powder by drying and sedimentation and subsequently by mechanical pulverization. Alternatively, commercially available porous inorganic particles (for example, silica dioxide sol) may be used. In order to form the low-refractive-index layers, the inorganic particles having micro voids are, preferably, dispersed in a suitable disperse medium. Preferably, preferred disperse media include water, alcohols such as methanol, ethanol, and isopropyl alcohol, and ketones such as methyl ethyl ketone and methyl isobutyl ketone.

If organic particles are used, preferably, they are also amorphous. Preferably, the organic particles are polymer particles synthesized by polymerization (for example, emulsion polymerization) of monomers. Preferably, the organic polymer particles contain elementary fluorine. Exemplary monomers containing elementary fluorine used for synthesizing a fluorine-containing polymer include: fluoroolefins such as fluoroethylene, vinylidene fluoride, tetrafluoroethylene, hexafluoropropylene, and perfluoro-2,2-dimethyl-1,3-dioxol; fluorinated alkylesters of acrylic acid or methacrylic acid; and fluorinated vinyl ethers. A copolymer of a monomer containing fluorine and a monomer not containing fluorine may be used. Exemplary monomers not containing fluorine include olefins such as ethylene, propylene, isoprene, vinyl chloride, and vinylidene chloride; acrylic esters such as methyl acrylate, ethyl acrylate, and 2-ethylhexyl acrylate; methacrylic esters such as methyl methacrylate, ethyl methacrylate, and butyl methacrylate; styrenes such as styrene, vinyltoluene, and a-methylstyrene; vinyl ethers such as methyl vinyl ether; vinyl esters such as vinyl acetate and vinyl propionate; acrylamides such as N-tert-butylacrylamide and N-cyclohexylacrylamide; methacrylamides; and acrylonitriles.

The micro voids in the organic particles can be formed by cross-linking polymers of the particles. By cross-linking the polymer molecules, the volume is reduced and thus the particles become porous. In order to cross-link the polymer molecules of the particles, preferably, monomers used to synthesize the polymer include 20 mol % of polyfunctional monomer. The content of the polyfunctional monomer is preferably in the range of 30 to 80 mol %, and most preferably in the range of 35 to 50 mol %. Exemplary polyfunctional monomers include dienes, such as butadiene and pentadiene; esters of polyhydric alcohol and acrylic acid, such as ethylene glycol diacrylate, 1,4-cyclohexane diacrylate, and dipentaerythritol hexacrylate; esters of polyhydric alcohol and methacrylic acid, such as ethylene glycol dimethacrylate, 1,2,4-cyclohexane tetramethacrylate, and pentaerythritol tetramethacrylate; divinyl compounds, such as divinylcyclohexane, 1,4-divinylbenzene; divinylsulfone; bisacrylamides, such as methylene bisacrylamide; and bismethacrylamides. Micro voids among particles can be formed by piling at least two particles.

The low-refractive-index layers may be formed of a material having pores and containing inorganic particles. In this instance, the low-refractive-index layers are formed by coating, and then the layer is subjected to activated gas treatment in which gas is removed from the layer to form pores. The low-refractive-index layers may be formed of a particle mixture containing at least two types of ultrafine particles (for example, $MgF_2$ and $SiO_2$) whose mixture ratio is varied in the thickness direction. By varying the mixture ratio, the refractive index is also varied. The ultrafine particles are adhered to each other with $SiO_2$ produced by the thermal decomposition of ethyl silicate. Also, in the thermal decomposition of ethyl silicate, the ethyl group burns to produce carbon dioxide and water vapor. By removing the carbon dioxide and the water vapor from the layer, pores are formed among the ultrafine particles. The low-refractive-index layers may contain a binder and inorganic particles constituted of porous silica, or it may be formed by piling at least two particles constituted of a polymer containing fluorine to form pores among the particles.

Some branch structure can increase the pore ratio. For example, polymers having a branch structure, such as dendrimer, can be formed into a low-refractive-index layer.

The refractive index of the resulting low-refractive-index layer formed of the above-described material is preferably 1.5 or less, and more preferably 1.2 or less. If the substrate 2 is formed of quartz, whose refractive index is 1.45, or glass, whose refractive index is 1.54, the low-refractive-index layer has a refractive index lower than that of the substrate 2.

In order to form the source electrode 243 and the drain electrode 244, first, the first insulating interlayer 283 is subjected to patterning by photolithography to form contact holes for the source electrode and the drain electrode. Next, a conductive layer is formed of a metal, such as aluminium, chromium, or tantalum, so as to cover the first insulating interlayer 283. Then, the regions of the conductive layer where the source and drain electrodes are to be formed are covered with a patterning mask and the conductive layer is subjected to patterning. Thus, the source electrode 243 and the drain electrode 244 are formed.

The second insulating interlayer 284 is formed of a material having a low refractive index on the first insulating interlayer 283, as in the first insulating interlayer 283. After forming the second insulating interlayer 284, a contact hole 23a is formed in the region of the second insulating interlayer 284 corresponding to the drain electrode 244.

The anode 23 connected to the luminescent element 3 is formed of a transparent electrode material, such as ITO, $SnO_2$ doped with fluorine, ZnO, or polyamine, and is connected to the drain electrode 244 of the TFT 24 through the contact hole 23a. In order to form the anode 23, the above-described transparent electrode material is deposited on the upper surface of the second insulating interlayer 284, followed by being patterned.

The third insulating layer (bank layer) 221 is formed of a synthetic resin, such as an acrylic resin or a polyimide resin. The third insulating layer 221 is formed after the anode 23 has been formed. Specifically, a resist, such as an acrylic resin or a polyimide resin, is dissolved in a solvent and this solution is applied to form an insulating layer by spin coating, dip coating, or the like. Any material can be used for the insulating layer, as long as it is insoluble in solvents for an ink described later and easy to pattern by etching. Furthermore, the insulating layer is simultaneously etched by photolithography or the like to form an opening 221a. Thus the third insulating layer having the opening 221a is completed.

At this point, the third insulating layer 221 is divided into a lyophilic (ink-philic) region and a liquid-repellent (ink-repellent) region. In this embodiment, these regions are formed in a plasma treatment process. The plasma treatment process includes a preheating step, the step of giving ink-philic characteristics to the side surface of the opening 221a and the surface of the pixel electrode 23, the step of giving ink-repellent characteristics to the upper surface of the third insulating layer 221, and a cooling step.

Specifically, a base material (the substrate 2 having the third insulating layer and other layers) is heated to a predetermined temperature (for example, about 70 to 80° C.), and subsequently, in the step of giving ink-philic characteristics, the base material is subjected to plasma treatment ($O_2$ plasma treatment) in an atmosphere of air, using oxygen as a reaction gas. Then, in the step of giving ink-repellent characteristics, plasma treatment ($CF_4$ plasma treatment) is performed in an atmosphere of air, using tetrafluoromethane as a reaction gas. The base material heated for the plasma treatments is cooled down to room temperature and, thus, the ink-philic and ink-repellent characteristics are given to the specific regions separately. The surface of the pixel electrode 23 is affected to some extent by the $CF_4$ plasma treatment. However, the material of the pixel electrode 23, such as ITO, does not have affinity to fluorine, and consequently, hydroxy groups introduced in the step of giving ink-philic characteristics are not replaced with fluoride groups, and the ink-philic characteristics are thus maintained.

In the embodiment, both the first insulating interlayer 283 and the second insulating interlayer 284 have a low refractive index. However, it is not necessary that both refractive indexes are low, and only one of the insulating interlayers may serve as a low-refractive-index layer.

In addition to the first and second insulating interlayers 283 and 284, the gate insulating layer 282 may also be formed of a material having a low refractive index. Thus, the efficiency of light emission to the outside can be increased. In order to improve the performance of the transistors such as TFTs, however, the gate insulating layer may advantageously be formed of a dielectric material in some cases.

Since low-refractive-index layers are provided in regions where light from the luminescent element 60 passes, layers other than the insulating layers may also be formed of a material having a low refractive index. Furthermore, the organic bank layer 221 may be a low-refractive-index layer.

The hole transfer layer 70 is disposed on the upper surface of the anode 23. The constituent of the hole transfer layer 70 is not particularly limited, and known materials can be used. Exemplary materials include pyrazoline derivatives, arylamine derivatives, stilbene derivatives, and triphenyldiamine derivatives. Specifically, materials disclosed in Japanese Unexamined Patent Application Publication Nos. 63-70257, 63-175860, 2-135359, 2-135361, 2-209988, 3-37992, and 3-152184, and preferably triphenyldiamine derivatives, are used. In particular, 4,4'-bis(N-(3-methylphenyl)-N-phenylamino)biphenyl is preferable.

Instead of the hole transfer layer, a hole injection layer may be formed. Both the hole injection layer and the hole transfer layer may be formed. In this instance, the constituent of the hole injection layer is, preferably, copper phthalocyanine (CuPc), polyphenylene-vinylene, namely, polytetrahydrothiophenylphenylene, 1,1-bis-(4-N,N-ditolylaminophenyl)cyclohexane, and tris-(8-hydroxyquinolinol) ammonium. In particular, copper phthalocyanine (CuPc) is preferable.

In order to form the hole injection/transfer layer 70, an ink jet technique can be applied. Specifically, an ink composition containing the above-described hole injection/transfer layer material is discharged onto the surface of the anode 23, followed by drying or heating, and thus the hole injection/transfer layer 70 is provided on the surface of the anode 23. Preferably, this hole injection/transfer layer forming step and its downstream steps are performed in an atmosphere of an inert gas, such as nitrogen or argon, in order to prevent the hole injection/transfer layer 70 and the luminescent layer (organic EL layer) 60 from oxidizing. For example, the discharge nozzle of an inkjet head (not shown in the drawings) filled with an ink composition containing the hole injection/transfer layer material is opposed to the surface of the anode 23. While the ink jet head and the base material (substrate 2) are being relatively moved, ink drops are discharged from the discharge nozzle onto the surface of the electrode, controlling the amount of the drops. Then, the discharged ink drops are dried to evaporate the polar solvent contained in the ink composition, and thus the hole injection/transfer layer 70 is formed.

As the ink composition, for example, a mixture of polythiophene derivatives, such as polyethylenedioxythiophene, and polystyrene sulfonic acid dissolved in a polar solvent, such as isopropyl alcohol, is used. Discharged ink drops spread over the surface of the anode 23 given the ink-philic characteristics and the bottom of the opening 221a. On the other hand, the surface of the third insulating layer 221 repels the ink drops because of the ink-repellent characteristics. Therefore, even if an ink drop deviates from a predetermined discharge position to put on the surface of the third insulating layer 221, the surface is not wetted with the ink drop, and the repelled ink drop falls into the opening 221a of the third insulating layer 221.

The luminescent element 60 is formed on the surface of the hole injection/transfer layer 70. It should be understood that the material of the luminescent element 60 is not particularly limited, and a low molecular-weight organic luminescent pigment or a macromolecular luminescent material, that is, a fluorescent or phosphorescent substance can be used without departing from the spirit and scope of the present invention. In particular, luminescent conjugated macromolecular compounds having an arylene-vinylene structure is preferable. Usable low molecular-weight fluorescent substances include, for example, naphthalene derivatives, anthracene derivatives, perylene derivatives, polymethine dyes, xanthene dyes, cumalin dyes, cyanine dyes, 8-hydroxyquinoline and metal complexes of its derivatives, aromatic amines, tetraphenylcyclopentadiene derivatives, and other known fluorescent substances disclosed in Japanese Unexamined Patent Application Publication Nos. 57-51781, 59-194393, and the like.

As for macromolecule fluorescent substances used as the material of the luminescent layer 60, macromolecules whose side chains have a fluorescent group can be used, but preferably, macromolecules whose main chains have a conjugated structure are used. In particular, polythiophene, poly(p-phenylene), poly(arylene-vinylene), and polyfluorene, and their derivatives are preferable. Poly(arylene-vinylene) and its derivatives are much preferable. The poly(arylene-vinylene) and its derivatives are polymers containing 50 mol % or more of the repetition unit expressed by chemical formula (1) relative to the total repetition units. Preferably, the content of the repetition unit expressed by chemical formula (1) is 70 mol % or more to the total repetition units though it depends on the structure of the repetition unit.

$$—Ar—CR\!\!=\!\!CR'— \quad (1)$$

(Ar represents an arylene or heterocyclic group in which the numbers of carbons involved in conjugated bonds is in the range of 4 to 20, and R and R' are each a group selected from the group consisting of hydrogen, alkyl groups having a carbon number in the range of 1 to 20, aryl groups having a carbon number in the range of 6 to 20, heterocyclic groups having a carbon number in the range of 4 to 20, and the cyano group).

In addition to the repetition unit expressed by chemical formula (1), the macromolecule fluorescent substance may contain other repetition units including an aromatic group or its derivative, a heterocyclic group or its derivative, and a group derived from their combination. The repetition unit expressed by chemical formula (1) and the other repetition units may be combined with each other by an unconjugated unit having ether, ester, amide, or imide. The repetition units may contain such an unconjugated unit.

Ar of the macromolecular fluorescent substance expressed by chemical formula (1) is an arylene or heterocyclic group in which the number of carbons involved in conjugated bonds is in the range of 4 to 20, and is an aromatic group or its derivative, heterocyclic group or its derivative, or a group derived from their combination which are expressed by chemical formulas (2) shown below.

[CHEM 1]

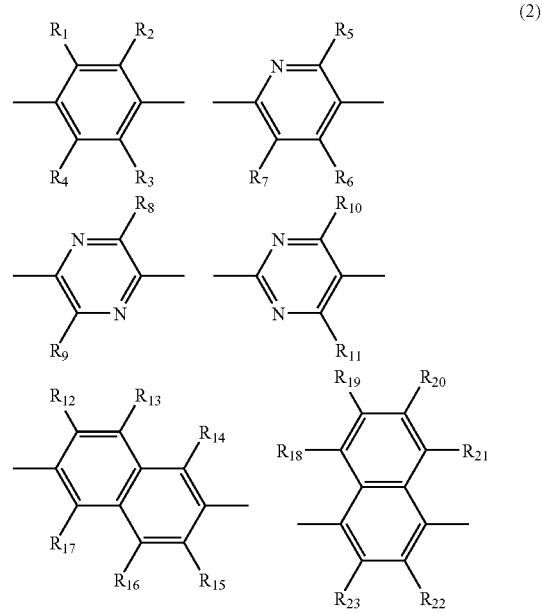

-continued

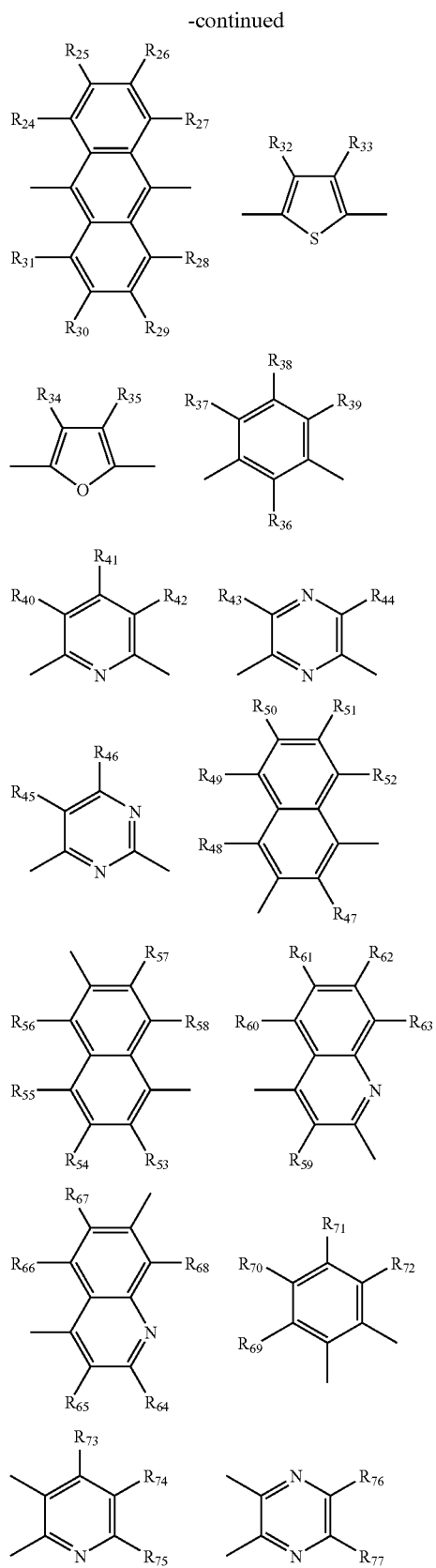

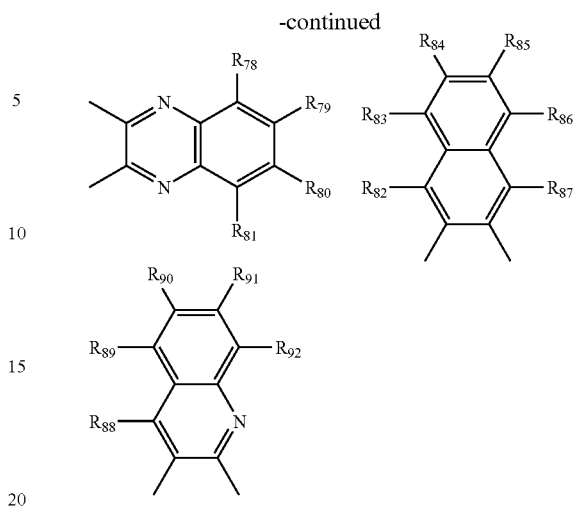

(R1 to R92 are each a group selected from the group consisting of hydrogen; alkyl, alkoxy and alkylthio having a carbon number in the range of 1 to 20; aryl and aryloxy having a carbon number in the range of 6 to 18, and a heterocyclic group having a carbon number in the range of 4 to 14.)

In these groups, preferred groups are phenylene, substituted phenylene, biphenylene, substituted biphenylene, naphthalenediyl, substituted naphthalenediyl, anthracene-9,10-diyl, substituted anthracene-9,10-diyl, pyridine-2,5-diyl, substituted pyridine-2,5-diyl, thienylene, and substituted thienylene. More preferred groups are phenylene, biphenylene, naphthalenediyl, pyridine-2,5-diyl, and thienylene.

When R and R' of chemical formula (1) are substituents other than oxygen or the cyano group, as for alkyl groups having a carbon number in the range of 1 to 20, the substituents include methyl, ethyl, propyl, butyl, pentyl, hexyl, heptyl, octyl, decyl, and lauryl, and preferably methyl, ethyl, pentyl, hexyl, heptyl, and octyl. As for aryl groups, the substituents include phenyl, 4-alkoxyphenyl having a carbon number in the range of 1 to 12, 4-alkylphenyl having a carbon number in the range of 1 to 12, 1-naphthyl, and 2-naphthyl.

Preferably, Ar includes at least one group selected from the group of: alkyl, alkoxy, and alkylthio having a carbon number in the range of 4 to 20; aryl and aryloxy having a carbon number in the range of 6 to 18; and a heterocyclic group having a carbon number in the range of 4 to 14.

Examples of these substituents are cited below. The alkyl groups having a carbon number in the range of 4 to 20 include butyl, pentyl, hexyl, heptyl, octyl, decyl, and lauryl, and preferably pentyl, hexyl, heptyl, and octyl. The alkoxy groups having a carbon number in the range of 4 to 20 include butoxy, pentyloxy, hexyloxy, heptyloxy, octyloxy, decyloxy, and lauryloxy, and preferably pentyloxy, hexyloxy, heptyloxy, and octyloxy. The alkylthio groups having a carbon number in the range of 4 to 20 include butylthio, pentylthio, hexylthio, heptylthio, octylthio, decylthio, and laurylthio, and preferably pentylthio, hexylthio, heptylthio, and octylthio. The aryl groups include phenyl, 4-alkoxyphenyl having a carbon number in the range of 1 to 12, 4-alkylphenyl having a carbon number in the range of 1 to 12, 1-naphthyl, and 2-naphthyl. The aryloxy groups include phenoxy. The heterocyclic groups include 2-thienyl, 2-pyrrolyl, 2-furyl, and 3- and 4-pyridyl. The number of these substituents is, preferably, at least one relative to a molecular weight of 600, form the viewpoint of obtaining a highly soluble macromolecular fluorescent substance, though the number depends the molecular weight of the macromolecular fluorescent substance and the structure of the repetition units.

The macromolecular fluorescent substance maybe a random, block, or graft copolymer, or a macromolecule having a structure intermediate between them, for example, a random copolymer partly having a block copolymer structure. From the viewpoint of obtaining a macromolecular fluorescent substance having a high quantum yield, the macromolecular fluorescent substance is, preferably, a random copolymer partly having a block copolymer structure, or a block or graft copolymer rather than a fully random copolymer. Also, the macromolecular fluorescent substance needs to emit light in a solid state because, in the resulting organic electroluminescent elements, fluorescence from a thin film is used.

If a solvent is used for the macromolecular fluorescent substance, preferred solvents include chloroform, methylene chloride, dichloroethane, tetrahydrofuran, toluene, and xylene. In general, at least 0.1% by weight of the macromolecular fluorescent substance can be solved in these solvents though the solubility depends on the structure and molecular weight of the macromolecular fluorescent substance.

Preferably, the molecular weight of the macromolecular fluorescent substance is in the range of $10^3$ to $10^7$ when calculated in terms of polystyrene, and the degree of polymerization depends on the repetition structure and repetition ratio of the molecule. In general, a preferred total number of the repetition units is 4 to 10,000, more preferably 5 to 3,000, and still preferably 10 to 2,000, from the viewpoint of film formability.

It should be understood that the method for synthesizing the macromolecular fluorescent substance is not particularly limited. However, for example, diphosphonium prepared from a dialdehyde having an arylene group combined with two aldehyde groups, a compound having an arylene group combined with two methyl halide groups, and triphenylphosphine is subjected to the Witting reaction. In another method, a compound having an arylene group combined with two methyl halide groups may be subjected to dehydrohalogenation. Also, the macromolecular fluorescent substance may be prepared by sulfonium salt decomposition in which an intermediate produced by polymerizing a. sulfonium salt having an arylene group combined with two methyl halide groups with an alkali is subjected to heat treatment. In any method, by adding a monomer compound having a skeleton other than arylene groups to vary the monomer content, the structure of the repetition units contained in the resulting macromolecular fluorescent substance can be varied. Thus, in order to perform copolymerization, materials may be prepared so that the content of the repetition unit expressed by chemical formula (1) becomes 50 mol % or more. In these methods, the method using the witting reaction is preferable, from the viewpoint of reaction controlling and the yield.

A method for synthesizing an arylene copolymer, which is one of the above-described macromolecular fluorescent substances, will now be described. In order to obtain the macromolecular fluorescent substance by the Witting reaction, first, for example, a bis-(methyl halide) compound, more specifically, for example, 2,5-dioctyloxy-p-xylylenedibromide is allowed to react with triphenylphosphine in a solvent, N,N-dimethylformamide, to synthesize a phosphonium salt. The product and a dialdehyde, more specifically, terephthalaldehyde, are subjected to condensation using lithium ethoxide in, for example, ethyl alcohol by the Witting reaction. Thus, a macromolecular fluorescent substance containing a phenylene-vinylene group and a 2,5-dioctyloxy-p-phenylenevinylene group is obtained. In this instance, in order to prepare a copolymer, at least two diphosphonium salts and/or at least two dialdehydes may be allowed to react.

When the macromolecular fluorescent substance prepared as in the above-described processes is used as the material of the luminescent elements, the purity of the substance affects luminous characteristics. It is, therefore, preferable to purify the substance by separation, such as reprecipitation or chromatography, after synthesis.

In order to generate full-color images, three materials, each having one of three colors red, green, and blue are used for forming the luminescent layer including the above-described macromolecular fluorescent substance. These materials are discharged onto the respective pixels AR in predetermined positions, using a patterning apparatus (ink jet apparatus).

The luminescent material may contain a host material and a guest material. In such a luminescent material, preferably, a macromolecular organic compound or a low-molecular-weight substance is used as the host material, and a fluorescent dye or a phosphorescent substance is used as the guest material to change the luminous characteristics of the resulting luminescent layer.

The macromolecular organic compound may be a low-solubility compound capable of forming a conjugated macromolecular organic electroluminescent layer through the processes of applying its precursor and subsequently being subjected to the heat curing reaction expressed by formula (3). For example, if its precursor is a sulfonium salt, the sulfonium group is removed by heat treatment to form a conjugated macromolecular organic compound.

Also, the macromolecular organic compound may be a high-solubility compound capable of forming a luminescent layer through the processes of applying the compound and removing the solvent.

[CHEM 2]

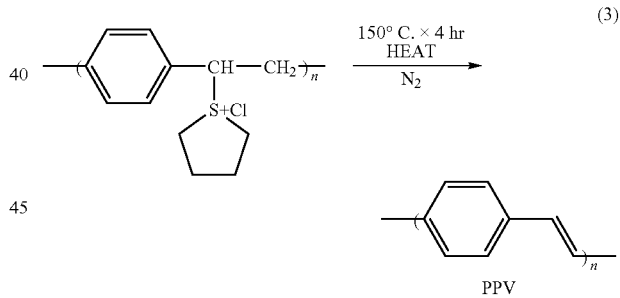

The above-described macromolecular organic compound is solid and highly fluorescent, and can be formed into a uniform solid ultrathin film. In addition, the macromolecular organic compound has excellent formability and enhanced adhesion to the ITO electrode, and is formed into a hard conjugated macromolecular film after curing.

For example, poly(arylene-vinylene) is suitable for the macromolecular organic compound. Poly(arylene-vinylene) is soluble in water-type solvents and organic solvents and facilitates the preparation of the liquid applied to the second base material 11. In addition, poly(arylene-vinylene) can be formed into a high-quality thin film in terms of optics because it can be polymerized under specific conditions.

Such poly(arylene-vinylenes) include PPV derivatives, such as PPV (poly(para-phenylene-vinylene), MO-PPV (poly(2,5-dimethoxy-1,4-phenylene)), CN-PPV (poly(2,5-bishexyloxy-1,4-phenylene-(1-cyanovinylene))), and MEH- PPV (poly[2-methoxy-5-(2'-ethylhexyloxy)]-para-phenylene-vinylene); poly(alkylthiophene), such as PTV (poly(2,5-thienylene-vinylene)); PFV (poly(2,5-furylene-vinylene)); poly(para-phenylene); and polyalkylfluorene. In particular, precursors of PPV and PPV derivatives, expressed by chemical formula (4), polyalkylfluorene expressed by chemical formula (5) (specifically, polyalkylfluorene copolymer expressed by chemical formula (6)) are preferable.

Since PPV and the like are highly fluorescent and are conductive macromolecules in which π-electrons forming double bonds are delocalized on the polymer chain, they can form a high-performance organic electroluminescent element.

[CHEM 3]

(4)

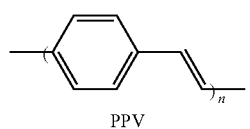
PPV

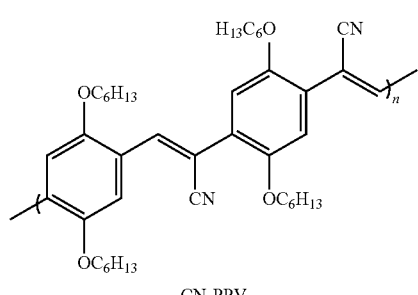
CN-PPV

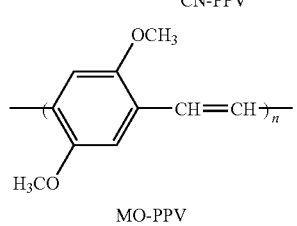
MO-PPV

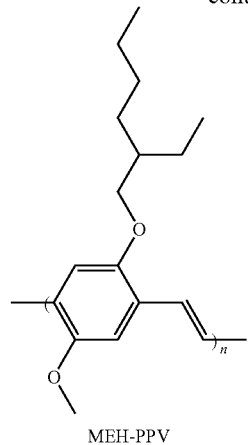
MEH-PPV

[CHEM 4]

(5)

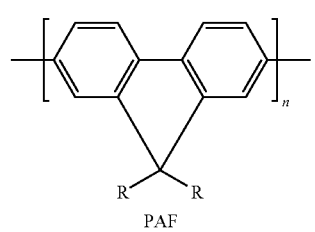
PAF

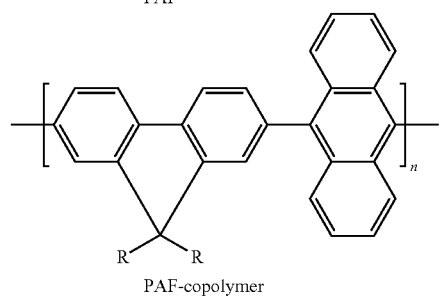
PAF-copolymer

[CHEM 5]

(6)

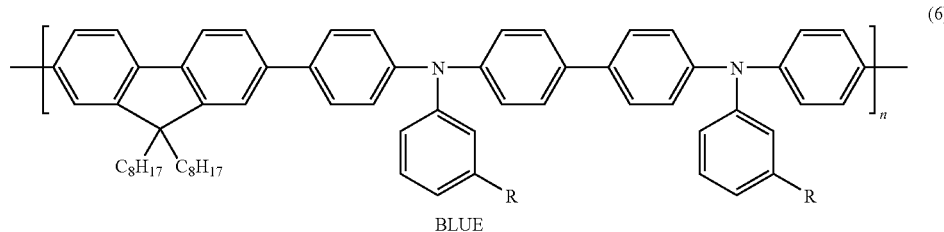
BLUE

-continued

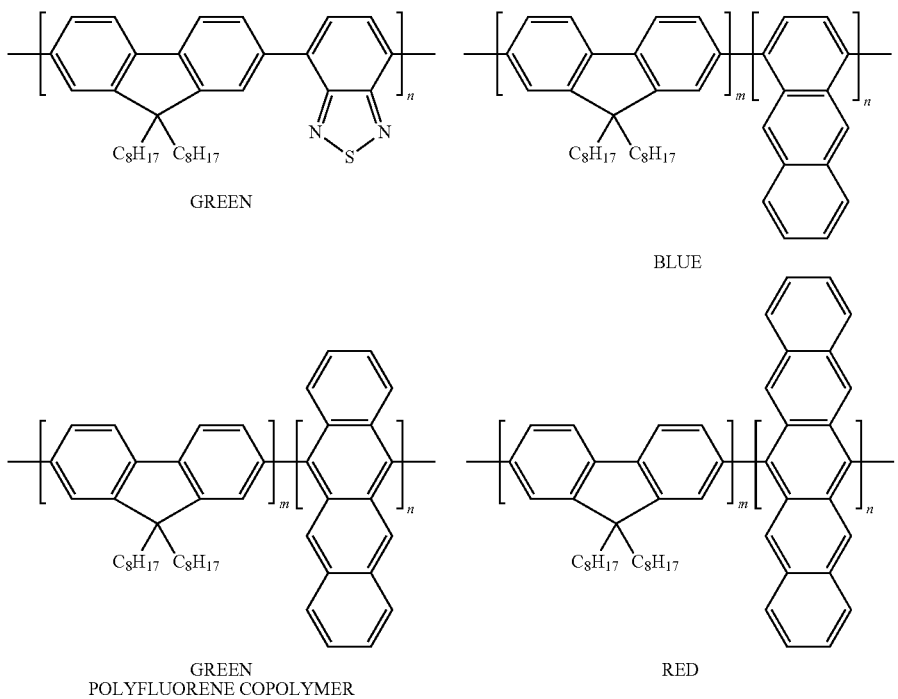

GREEN

BLUE

GREEN
POLYFLUORENE COPOLYMER

RED

Usable macromolecular organic compounds and low-molecular-weight materials, other than the PPV thin film, used for forming the luminescent layer, that is, materials used for the host material in the embodiment, include, for example, generally known materials, such as aluminium quinolinol complex (Alq3), distyrylbiphenyl, BeBq$_2$ and Zn(OXZ)$_2$ expressed by chemical formula (7), TPD, ALO and DPVBi; and pyrazoline dimers; quinolizine carboxylic acid; benzopyrylium perchlorate; benzopyranoquinolizine; rubrene; and phenanthroline europium complex. Using at least one of these materials, an organic electroluminescent element composition can be prepared.

[CHEM 6]

(7)

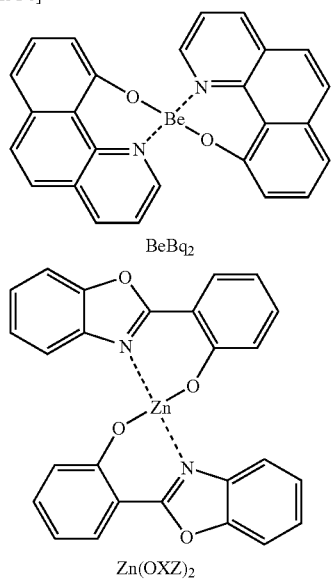

BeBq$_2$

Zn(OXZ)$_2$

Guest materials added to the host material include the above-described fluorescent dyes and phosphorescent substances. In particular, the fluorescent dyes can change the luminous characteristics of the luminescent layer, and can, therefore, increase the luminous efficacy of the luminescent layer and change the maximum wavelength of light absorption (luminescent color). Accordingly, the fluorescent dyes can be used as not only a luminescent layer material, but also a color material for functioning to emit light. For example, the energy of excitons generated by the recombination of the carriers on conjugated macromolecular organic compound molecules can be shifted onto fluorescent dye molecules. In this instance, the current quantum efficiency of the luminescent layer increases because luminescence is generated from only fluorescent dye molecules having high fluorescence quantum efficiency. Therefore, by adding the fluorescent dye to the luminescent layer material, the emission spectrum of the fluorescent molecules includes that of the luminescent layer. Thus, the fluorescent dye can advantageously serve to change the luminescent color.

The current quantum efficiency here is a yardstick for evaluating luminescent performance on the basis of luminescent functions, and is defined by the following equation.

$\eta E$=released photon energy/input electric energy

Also, by doping the luminescent layer with fluorescent dyes to change the maximum wavelength of light absorption, for example, three primary colors, red, blue, and green, can be emitted, and consequently, a full color display can be achieved. Furthermore, by doping the luminescent layer with fluorescent dyes, the luminous efficacy of the electroluminescent element can be increased.

When the luminescent layer emits red light, preferably, a laser dye DCM-1, rhodamine, rhodamine derivatives, phenylene, and the like are used as a fluorescent dye. By doping the host material, such as PPV, with these fluorescent dyes, a luminescent layer can be formed. Since many of these fluorescent dyes are soluble in water, further uniform luminescent layer can be formed by doping a sulfonium salt, which is a water-soluble PPV precursor, with such a fluorescent dye and subsequently by heating. Specifically, these fluorescent dyes include rhodamine B, rhodamine B base, rhodamine 6G, and rhodamine 101 perchlorate. They may be used in combination.

When the luminescent layer emits green light, preferably, quinacridone, rubrene, DCJT, and DCJT derivatives are used as a fluorescent dye. As in the case with the foregoing fluorescent dyes, by doping the host material, such as PPV, with these fluorescent dyes, the luminescent layer can be formed. Since many of these fluorescent dyes are soluble in water, further uniform luminescent layer can be formed by doping a sulfonium salt, which is a water-soluble PPV precursor, with such a fluorescent dye and subsequently by heating.

When the luminescent layer emits blue light, preferably, distyrylbiphenyl and its derivatives are used as a fluorescent dye. As in the case with the foregoing fluorescent dyes, by doping the host material, such as PPV, with these fluorescent dyes, the luminescent layer can be formed. Since many of these fluorescent dyes are soluble in water, further uniform luminescent layer can be formed by doping a sulfonium salt, which is a water-soluble PPV precursor, with such a fluorescent dye and subsequently by heating.

Other fluorescent dyes capable of emitting blue light include coumarin and its derivatives. These fluorescent dyes have good compatibility with PPV and, consequently, facilitate the formation of the luminescent layer. In these dyes, some types of coumarin are insoluble in solvents. By selecting a suitable substituent, however, the solubility can be increased and they can become soluble in solvents. Specifically, these fluorescent dyes include coumarin 1, coumarin 6, coumarin 7, coumarin 120, coumarin 138, coumarin 152, coumarin 153, coumarin 311, coumarin 314, coumarin 334, coumarin 337, and coumarin 343.

Other fluorescent dyes capable of emitting blue light include tetraphenylbutadiene (TPB), TPB derivatives, and DPVBi. As in the case with the forgoing red fluorescent dyes, these fluorescent dyes are soluble in water and have good compatibility with PPV, consequently facilitating the formation of the luminescent layer.

All the fluorescent dyes described above may be used singly or in combination.

As such fluorescent dyes, the compounds expressed by chemical formulas (8), (9), and (10) may be used.

[CHEM 7]

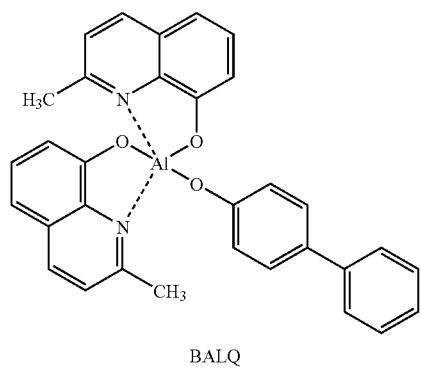

BALQ (8)

-continued

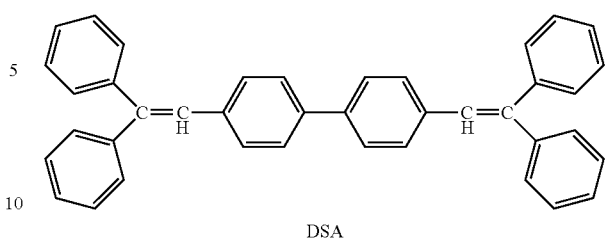

DSA

[CHEM 8]

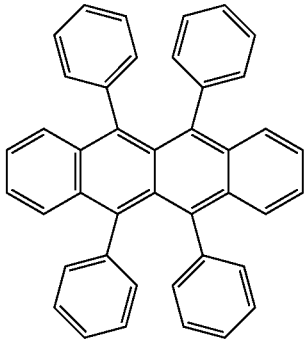

(9)

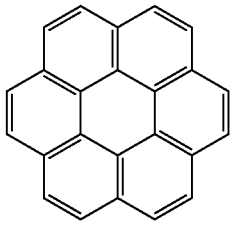

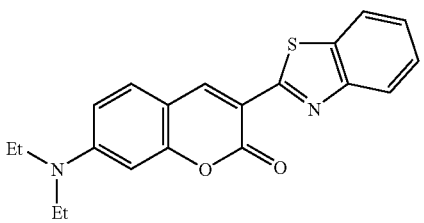

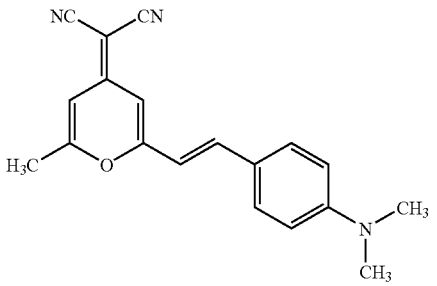

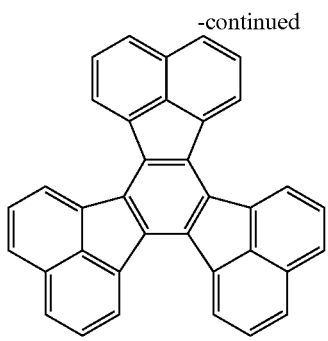
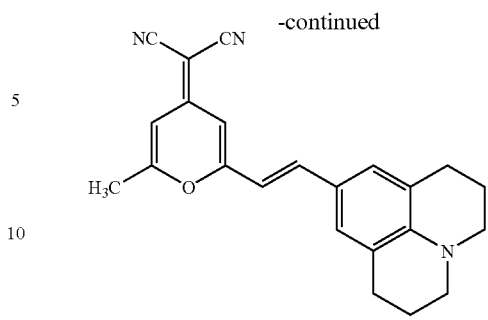
[CHEM 9]
(10)
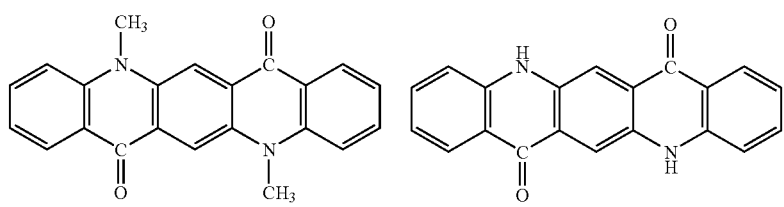
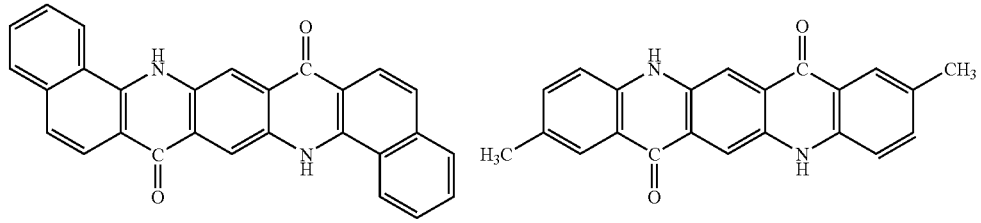
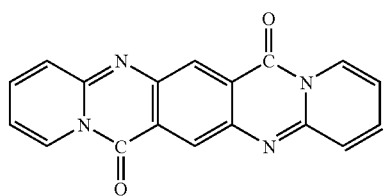
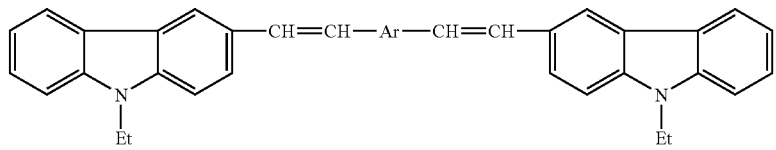
BCzVB Ar = 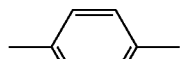
BCzVBi Ar = 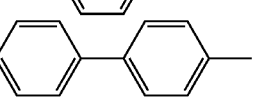

Preferably, the fluorescent dye is added, by a method described in greater detail below, in an amount of 0.5% to 10% by weight to the host material containing the above-described conjugated macromolecular organic compound and the like, and more preferably in an amount of 1.0% to 5.0% by weight. An excessive amount of the fluorescent dye degrades the weather resistance and durability of the resulting luminescent layer. In contrast, an excessively small amount of the fluorescent dye does not lead to sufficient results.

As phosphorescent materials added to serve as a guest material, preferably, Ir(ppy)$_3$, Pt(thpy)$_2$, and PtOEP expressed by chemical formula (11) and the like are used.

[CHEM 10]

(11)

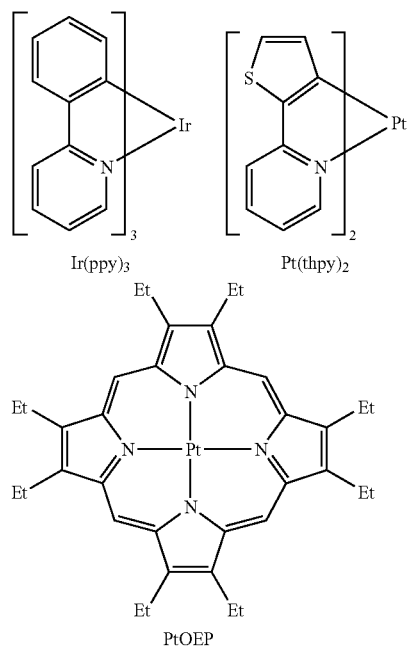

PtOEP

When one of the phosphorescent materials of chemical formula (11) is used as the guest material, CBP, DCTA, and TCPB which are expressed by chemical formula (12) and the above-described DPVBi and Alq3 are advantageously used as the host material.

The above-described fluorescent dyes and phosphorescent materials may be added together to the host material to serve as guest materials.

(12)

[CHEM 11]

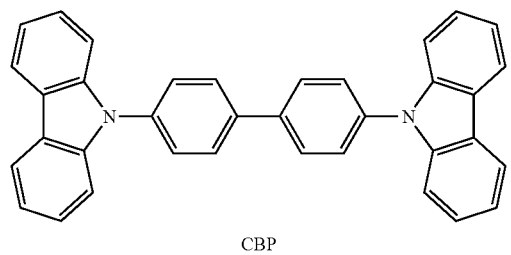

CBP

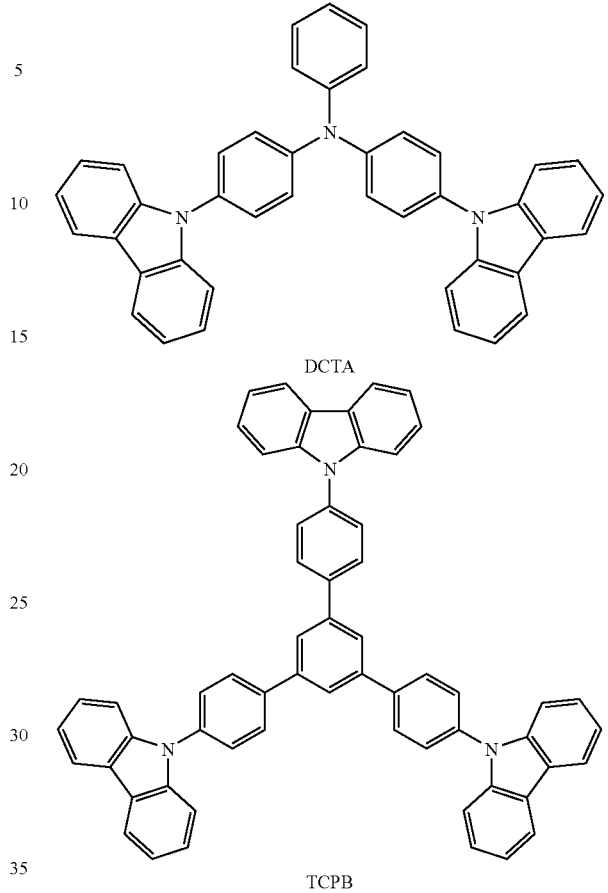

DCTA

TCPB

When the luminescent layer 60 includes these host/guest type materials, a plurality of material supply systems, such as nozzles, are provided to a patterning apparatus (ink jet apparatus) in advance, and the nozzles simultaneously discharge the host and guest materials at a predetermined ratio. Thus, the luminescent layer 60 can be formed which comprises a luminescent material prepared by adding a desired amount of the guest material to the host material.

The luminescent layer 60 is formed as in the procedure for forming the hole injection/transfer layer 70. Specifically, an ink composition containing luminescent materials are deposited on the surface of the hole injection/transfer layer 70 by ink jet technique, followed by drying and heating. Thus, the luminescent layer 60 is formed on the hole injection/transfer layer 70 in the opening 221a formed in the third insulating layer 221. This luminescent layer-forming step can also be conducted in an atmosphere of an inert gas. The discharged ink composition is repelled form the region subjected to ink-repellent treatment. Therefore, even if an ink drop deviates from a predetermined discharge position, the repelled ink drop falls into the opening 221a of the third insulating layer 221.

The electron transfer layer 50 can be formed on the upper surface of the luminescent layer 60. The electron transfer layer 50 is also formed by an ink jet technique, as in the luminescent layer 60. The material of the electron transfer layer 50 is not particularly limited. Exemplary electron transfer layer materials include oxadiazole derivatives, anthraquinodimethane and its derivatives, benzoquinone and its derivatives, naphthoquinone and its derivatives, anthraquinone and its derivatives, tetracyanoanthraquinodimethane and its derivatives, fluorenone derivatives, diphenyldicyanoethylene and its derivatives, diphenoquinone derivatives, and 8-hydroxyquinoline and metal complexes of its derivatives. Specifically, materials disclosed in Japanese Unexamined Patent Application Publication Nos. 63-70257, 63-175860, 2-135359, 2-135361, 2-209988, 3-37992, and 3-152184, preferably triphenyldiamine derivatives are used, as in the above-described hole transfer layer. In particular, 2-(4-biphenylyl)-5-(4-t-butylphenyl)-1,3,4-oxadiazole, benzoquinone, anthraquinone, and tris(8-quinolinol)aluminum are preferable.

The materials of the hole injection/transfer layer 70 and the electron transfer layer 50 may be mixed with the material of the luminescent layer 60 to be used as a luminescent layer material. In this instance, the contents of the hole injection/transfer material and the electron transfer material are appropriately determined so as not to suppress the film formability and luminous characteristics though the contents depend on the types of the compounds used. They are generally in the range of 1% to 40% by weight relative to the luminescent material, and preferably in the range of 2% to 30% by weight.

It should be understood that the hole injection/transfer layer 70 and the electron transfer layer 50 are not limited to being formed by an ink jet technique, but may be formed by mask deposition.

The cathode 222 may cover the entire surfaces of the electron transfer layer 50 and the third insulating layer 221, or may be disposed in a striped manner. The cathode 222 may be formed in a single layer of an elementary substance, such as Al, Mg, Li, and Ca, or an alloy of Mg:Ag (10:1), or in two or three metal (including alloy) layers. Specifically, a laminate, such as $Li_2O$ (about 0.5 nm)/Al, LiF (about 0.5 nm)/Al, or $MgF_2$/Al, may be used. The cathode 222 is a light-transmissive metal thin film.

The sealing layer 20 is intended to prevent air from entering the organic EL elements from the outside, and the thickness and the material are appropriately selected. As the material of the sealing layer 20, for example, ceramic, silicon nitride, silicon nitride oxide, or silicon oxide is used. In particular, silicon nitride oxide is preferable from the viewpoint of transparency and gas interruption. The sealing layer 20 may be formed on the cathode 222 by plasma CVD.

As described above, light emitted from the luminescent layer 60 passes through the insulating layers 283 and 284 formed of a material having a refractive index lower than that of the substrate 2 and enters the substrate 2. Light entering the insulating layers 283 and 284 at an angle more than or equal to the critical angle is refracted in a direction forming an angle less than or equal to the critical angle at the interface with the substrate 2, and is thus deviated from total reflection conditions to be emitted to the outside. Thus, light emission efficiency can be increased to achieve an enhanced visibility. There is a strong correlation between the refractive index and the dielectric constant. The low-refractive-index insulating layers 283 and 284 have low dielectric constants, and consequently, the capacity between wires can be reduced. Thus, the operation performance of electro-optical devices, such as operation speed, can be enhanced.

In addition to the hole injection/transfer layer 70, the luminescent layer 60, and the electron transfer layer 50, a hole blocking layer may be provided on the opposing electrode 222 side of the luminescent layer 60 to increase the lifetime of the luminescent layer 60. The constituent of the hole blocking layer may be BCP expressed by chemical formula (13) or BAlq expressed by chemical formula (14), and preferably BAlq is used, from the viewpoint of the increase of lifetime.

[CHEM 12]

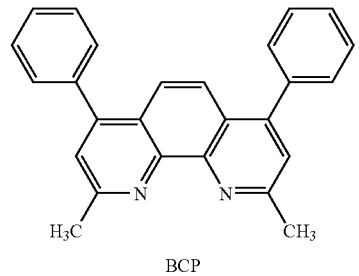

BCP (13)

[CHEM 13]

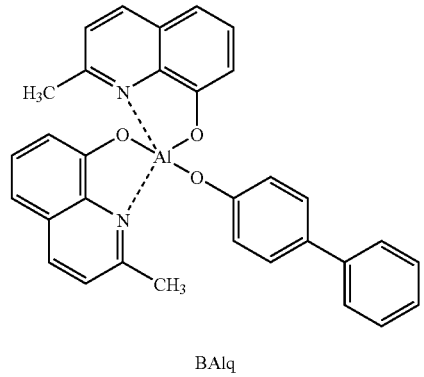

BAlq (14)

An electronic apparatus including an organic EL display device according to the above-described embodiment will now be describe.

Figure 4:
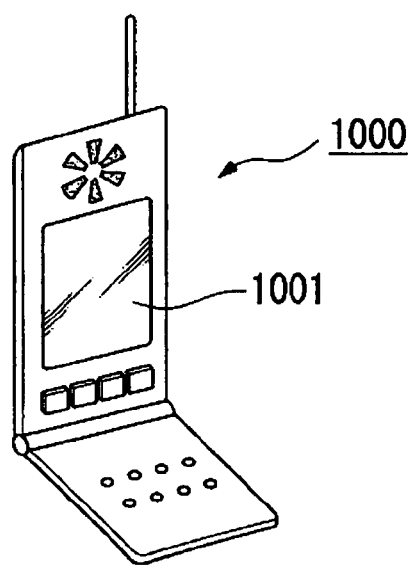
FIG. 4 is an illustration of an electronic apparatus including an electro-optical device of the present invention.

FIG. 4 is a perspective view of a cellular phone. In FIG. 4, reference numerals 1000 and 1001 represent a body of the cellular phone and a display using the above-described organic EL display device, respectively.

Figure 5:
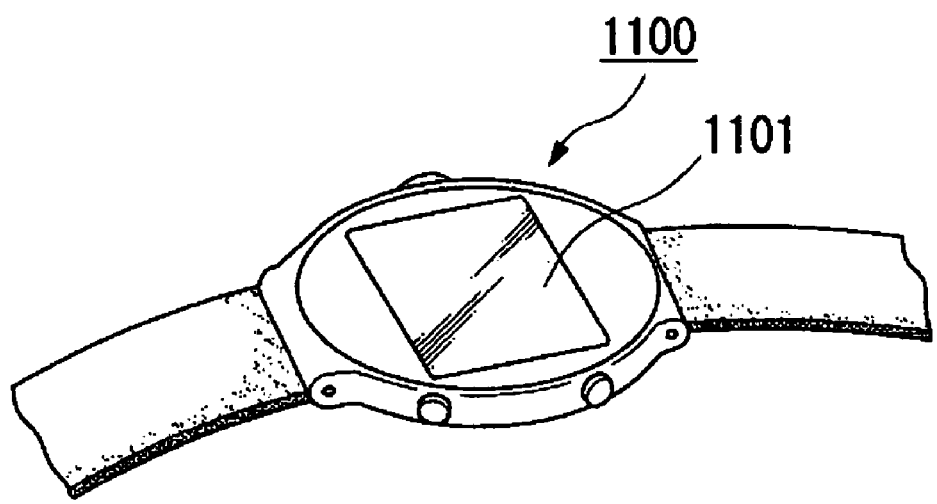
FIG. 5 is an illustration of an electronic apparatus including an electro-optical device of the present invention.

FIG. 5 is a perspective view of a wrist watch type electronic apparatus. In FIG. 5, reference numerals 1100 and 1101 represent a body of the wrist watch and a display using the above-described organic EL display device, respectively.

Figure 6:
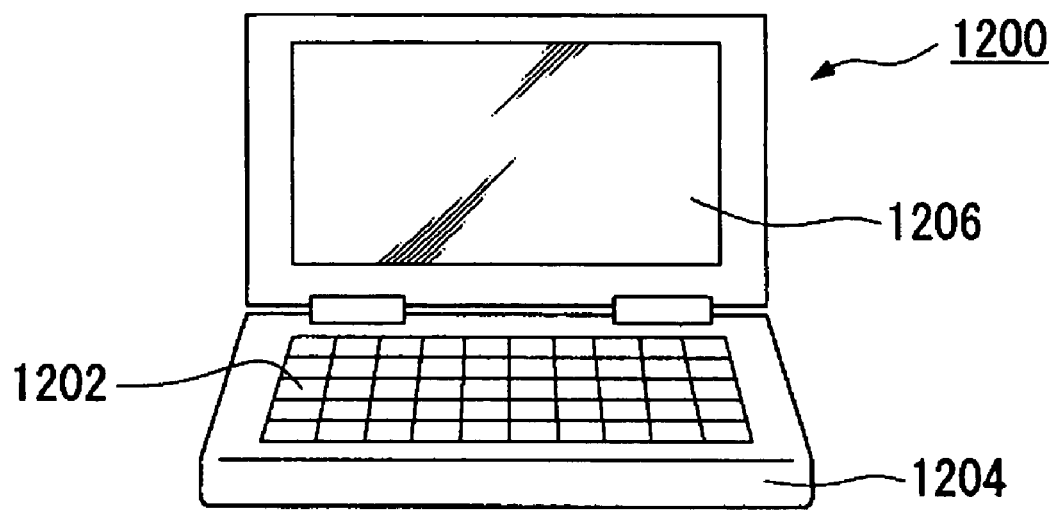
FIG. 6 is an illustration of an electronic apparatus including an electro-optical device of the present invention.

FIG. 6 is a perspective view of a portable information processing apparatus, such as a word processor or a personal computer. In FIG. 6 reference numerals 1200, 1202, 1204, and 1206 represent an information processing apparatus, an input region, such as a keyboard, a body of the information processing apparatus, and a display including the above-described organic EL display device, respectively.

Since the electronic apparatuses shown in FIGS. 4 to 6 each include the organic EL display device according to the above-described embodiment, high-quality, bright images can be achieved.

It should be understood that the technical scope of the present invention is not limited to the embodiments illustrated above, but that various modifications may be made without departing from the spirit and scope of the invention.

For example, in the embodiment, the organic EL element includes the luminescent layer and the hole transfer layer which are held between a pair of electrodes, however, the organic EL element may include organic layers having various functions, such as an electron transfer layer, a hole injection layer, and an electron injection layer, in addition to the luminescent layer and the hole transfer layer. Also, the materials cited in the embodiment are no more than examples and can be changed, if necessary.

In the display device S1 of the embodiment, the luminescent layer 60 acting as an electro-optical element may be replaced with a liquid crystal layer or other optical display materials.

In the embodiment, a back emission type display device in which light is emitted from the substrate 2 side having the TFTs 24 is described. However, the low-refractive-index layer of the present invention can be used in a so-called top emission type display device in which light is emitted from the other side opposite the substrate having the TFTs.

According to the present invention, light emitted from electro-optical elements passes through low-refractive-index material layers having a refractive index lower than that of the substrate and enters the substrate. Light entering the low-refractive-index layers at an angle more than or equal to the critical angle is refracted in a direction forming an angle less than or equal to the critical angle at the interface with the substrate, and is thus deviated from total reflection conditions to be emitted to the outside. Thus, light emitting efficiency can be increased to achieve an enhanced visibility. Also, there is a strong correlation between the refractive index and the dielectric constant. By forming predetermined material layers having a low refractive index, the resulting low-refractive-index layers have a low dielectric constant, and consequently, the capacity between wires can be reduced. Thus, the operation performance of electro-optical devices, such as operation speed, can be enhanced.

What is claimed is:

1. An electro-optical device comprising:
   a substrate;
   a first electrode;
   a second electrode opposite to the first electrode;
   an electro-optical element disposed between the first electrode and the second electrode; and
   a plurality of material layers including two low-refractive-index layers each of which includes a low-refractive index material having a refractive index lower than a refractive index of the substrate, the two low-refractive index layers contacting each other and the two low-refractive index layers being disposed entirely between the substrate and the first electrode.

2. The electro-optical device according to claim 1,
   the plurality of material layers including at least one insulating interlayer formed of the low-refractive index material.

3. The electro-optical device according to claim 1,
   the refractive index of the low-refractive-index layer being 1.5 or less.

4. The electro-optical device according to claim 1,
   the refractive index of the low-refractive-index layer being 1.2 or less.

5. The electro-optical device according to claim 1,
   the low-refractive-index material being light-transmissive and porous.

6. The electro-optical device according to claim 1,
   the low-refractive-index material further including at least one of aerogel, porous silica, magnesium fluoride, fluoropolymers, and porous polymers.

7. The electro-optical device according to claim 1,
   the low-refractive-index material further including a predetermined material containing at least one of inorganic particles or organic particles.

8. The electro-optical device according to claim 1,
   the low-refractive-index material further including a gel in which magnesium fluoride particles are dispersed.

9. The electro-optical device according to claim 1, further comprising:
   an active element.

10. The electro-optical device according to claim 9,
    the active element being a transistor.

* * * * *